United States Patent [19]

Koh et al.

[11] Patent Number: 4,948,709

[45] Date of Patent: Aug. 14, 1990

[54] PRODUCTION OF BUSINESS CARDS AND THE LIKE

[75] Inventors: Soo L. Koh; Soo K. Koh; Soo H. Koh, all of Selangor, Malaysia

[73] Assignee: Color Processing System SDN BHD., Selangor, Malaysia

[21] Appl. No.: 343,908

[22] Filed: Apr. 26, 1989

Related U.S. Application Data

[63] Continuation-in-part of Ser. No. 229,916, Aug. 8, 1988, abandoned, which is a continuation-in-part of Ser. No. 823,071, Jan. 27, 1987, abandoned.

[30] Foreign Application Priority Data

Jan. 31, 1985 [GB] United Kingdom ................. 8502444

[51] Int. Cl.[5] ................................................ G03F 3/04

[52] U.S. Cl. ...................................... 430/364; 430/11; 430/22

[58] Field of Search .................... 430/434, 364, 11, 22

[56] References Cited

U.S. PATENT DOCUMENTS 3,615,479 10/1971 Kohler et al. ....................... 430/434

OTHER PUBLICATIONS

"Focal Encyclopedia of Photography", pp. 346-347, 1972.

Horder, "The Manual of Photography", pp. 410-421, 1972.

*Primary Examiner*—John L. Goodrow

[57] ABSTRACT

A method of producing business cards, name cards and the like in color comprising pictures as well as or instead of text, in which complete artwork, comprising pictures, symbols, logos, numerical and/or alphabetic characters, in color and in any desired arrangement, is copied as a single color negative; the exposed color negative is processed, the processed color negative is printed onto color photographic paper, and the latter after processing is cut to size to provide the desired number of cards in color. The exposed color negative is processed in a manner providing very high-contrast. Only a single medium namely the color negative is used as an intermediate between the artwork and the finished card.

2 Claims, 1 Drawing Sheet

PRODUCTION OF BUSINESS CARDS AND THE LIKE

CROSS-REFERENCE TO RELATED APPLICATION

The present invention is a continuation-in-part of application Ser. No. 07/229,916 filed Aug. 8, 1988 now abondoned which is itself a continuation-in-part of application Ser. No. 06/823,071 filed Jan. 27, 1987 now abndoned.

BACKGROUND OF THE INVENTION

This invention relates to the production of business cards, name cards and the like.

The object of the present invention is to provide an improved method of producing business cards, name cards and the like in color comprising pictures as well as or instead of text.

To produce a card in color by offset printing involves preparing artwork; preparing a positive colour transparency of the artwork; preparing color-separated positives corresponding to the colors to be printed (yellow, magenta, cyan and black); and four-colour offset printing on plain paper. This process is too costly for low-volume production, and the preparation of the artwork is usually complicated and costly.

Another process comprises contact printing on colour photographic paper. This involves paste-up of text; one-to-one reproduction into line film; one-to-one contact printing onto color photographic paper; and processing of the exposed paper. This process severely restricts the material that can be shown on the finished card, the insertion of pictures is difficult or impossible, the provision for full color text is limited, and dyeing of the film is necessary to print colored text.

In another process, a picture and text can be provided in separate areas of the card. A paste-up of text is reproduced to one-to-one into line film; a separate color negative of the product or person to be shown is made; color photographic paper is first exposed in one area, to the color negative, then another area is exposed by one-to-one contact printing of the line film; the exposed paper is then processed. This process is troublesome, and the color negative cannot be merged with the line film text, restricting creativity and design.

U.S. Pat. No. 3,614,839 describes a process for producing personal identity (ID) cards. The specification is primarily directed to producing a secure ID card in which a color print is bonded between a pair of vinyl sheets. The specification mentions the simultaneous photographing of the subject and descriptive matter relating to the subject. The processing of the film is described as being expeditiously accomplished using conventional instant developing, e.g. Polaroid, film.

Producing business cards in a single exposure step and developing the exposed negative either by conventional instant developing techniques, or by other processes as specified by film manufacturers often results in a final print which is of unsatisfactory quality.

U.S. Pat. No. 4 055 833 (Rothfjell) describes a method of enhancing contrast. This method involves making an image comprising only one of the basic colors of the colored photograph, the contrast of the image being enhanced so that only the areas of the subject which are most strongly colored in the basic color are reproduced. The weak shades of the selected basic color are suppressed.

The Rothfjell process involves a complex lens system using filters to suppress weakly shades of color and to enhance the strongly shaded areas of that color. The Rothfjell process emphatically teaches the use of conventional processing techniques in the development and printing of the color film.

The film of contrast enhancement taught by the Rothfjell patent is not suitable for overcoming the above mentioned problem encountered with the conventional processing film in the production of the single exposure business cards. This is because: (a) the Rothjell method only deals with the contrast of one color; and (b) the method involves the use of complex equipment and processing stages in the production of the final photograph.

An article first published in a magazine entitled "You and Your Camera" published in England by Eaglemoss Publications Limited is reproduced (subject to adaptation and re-editting) in North America by H P Books. The North American publication of 1982 bears the Library of Congress catalogue no. 82-82769. This article discusses the achievement of high-contrast images in the development of LITHO and PAN films. This article is restricted to the achievement of high-contrast in black and white film by under exposing the film or by controlling temperature.

This article gives no clues as to how contrast may be improved in color photography, and gives no hint as to how good quality photographic prints for business card use may be obtained from a single exposure of artwork which includes unwanted detail (i.e. boundary lines between similar shaded areas of the pasted-up artwork and the mounting board itself).

As discussed in considerable detail in an article entitled "Monitoring System for Procesing Koda Color [Trade Mark] II film in Kodak Flexicolor [Trade Mark]chemicals" published by Eastman Kodak Company in 1972, correctly processed negatives for color film can only be achieved according to the art by developing the film strictly in accordance with the manufacturer's specification. The document teaches that proper density, contrast and color balance can only be achieved by developing the film strictly in accordance with the manufacturers developing specifications.

In the final print of business card produced by conventional developing techniques, the subject of the business card tends not to stand out clearly from the background. A more significant problem arises from the fact that boundary lines, which are present between areas of the pasted-up artwork and similar shaded areas of the mounting board from which the single negative is obtained in a single exposure step show up in the final print. This tends to make the resulting business card look untidy.

The presence of the boundary lines and other unwanted detail arises from the fact that conventional processing techniques tend to give a relatively normal contrast between similar shades of the same color. This is desirable if it is desired to take photographs of whole scenic views (i.e. landscapes) or to take portrait photographs, where it is desirable to maintain contrast between similar shades of similar colors on the one hand while preventing excessive contrast between light and dark shades on the other hand. Excessive contrast between light and dark shades would not be desirable in, for example, a portrait because dark colors would be too prominent in the photograph while weakly shaded areas would be too feint and detail would be lost.

OBJECT OF THE INVENTION

It is therefore an object of the present invention to provide a method of producing full color business cards by photographing a subject consisting of artwork pasted-up on to a background using only a single exposure, wherein the single exposure exposes a single color negative after which the negative is processed and printed on to color photographic paper such that there is high-contrast between light and dark colors, (in order that the subject of the business card is bold and stands out) and such that contrast between similar shades of similar colors is suppressed so that boundary lines present between areas of the pasted-up artwork and the similar shaded areas of the background mounting board disappear thereby leaving a clear and tidy business card.

SUMMARY OF THE INVENTION

According to the present invention, there is provided, in a method for producing business cards, name cards and the like in color, the steps comprising: (a) assembling images and characters into a composite artwork for a business card, name card or the like, said images and characters comprising a multiplicity of colors; (b) exposing in a single step a unit of color film to said artwork to reproduce it thereon; (c) developing said exposed unit of color film under processing condition which are abnormal with respect to the processing conditions as generally specified by the manufacturer of the color film, which processing conditions involves one of: (i) immersing said exposed unit of color film in a first chemical, at a given temperature, for a developing time which exceeds the maximum time specified by the manufacturer for said given temperature; (ii) developing for a given time period, the exposed unit of color film in the first chemical at a temperature which exceeds the maximum specified by the manufacturer for said given time period; in order to provide a single developed color negative having very high-contrast and containing all of said artwork; (d) printing only said single developed color negative onto color photographic paper in the desired size to reproduce the artwork thereon in a multiplicity of colors substantially corresponding to those of said artwork; and (e) cutting said printed color photographic paper to the desired card size and thereby to provide a desired card in color.

In an embodiment of the invention, a high-contrast color business card is produced by processing the exposed single color negative in the developer chemical for four minutes and thirty seconds, the developer chemical being at 40° C.

Producing business cards in accordance with the present invention has been found to suppress the contrast between similarly shaded colors in the negative while increasing contrast between light and dark shades.

The process according to the invention serves to enhance the overall density of the developed unit of color film while also achieving a very high-contrast. The consequence of this is that, there is a high-contrast between light and dark colors (which results in the subject of the business card and in particular the text standing out more boldly). In addition, an area of one color and shade on the boundary of the artwork which is only slightly different in shade and/or color with that of the background mounting board will merge with the background. That is to say, unwanted boundary lines will disappear.

BRIEF DESCRIPTION OF THE DRAWINGS

The invention will now be further described by way of example with reference to the following specific example and the accompanying drawings in which.

DETAILED DESCRIPTION OF THE PREFERRED EMBODIMENT

Figure 1:
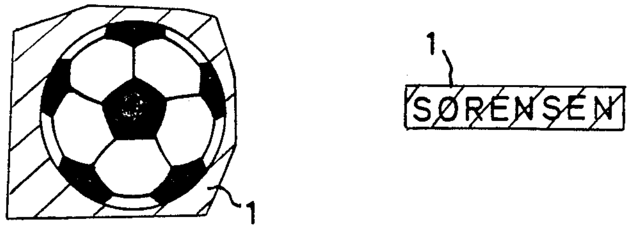
FIG. 1 illustrates pieces of artwork to be pasted-up on to a mounting board.

FIG. 1 shows two pieces of artwork which represent artwork which has been, for example, cut-out of a magazine. The artwork comprises a picture of a football and a footballer's name. The footballer's name is in block lettering which is on a background represented by the shaded area (which may be off-white in color). The color of this background is similar to but not the same as the color of a mounting board (not shown) to which the artwork is to be mounted. The footballer has a similar shaded background.

When the artwork is pasted-up on the mounting board, which may be, say, plain white as opposed to off-white there is a boundary line 1 between the cut-out artwork and the board. A space 3 may be provided for a picture of the footballer which can be arranged to appear in the space 3.

After pasting the artwork on to a mounting board, a unit of color film is exposed to the artwork and board in a single step.

Figure 2:
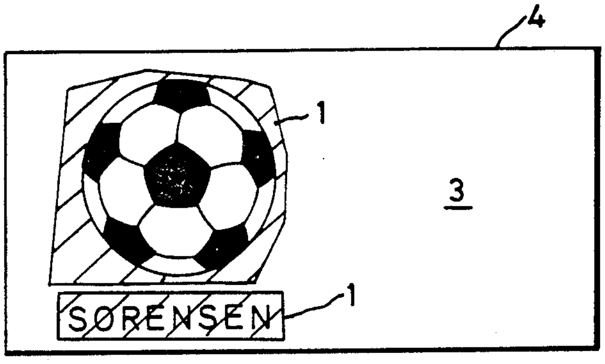
FIG. 2 illustrates a business card produced from the artwork of FIG. 1 in accordance with conventional processing.

In FIG. 2, a photographic print 4 has been produced from the exposed negative developed in accordance with convention processing techniques specified below.

In this example, the print is intended to be the business card of a football player, the space designated by numeral 4 being provided for the football player's picture. On the left-hand side of the card 1 the football is reproduced comprising pentagonal black and hexagonal white segments sewn together. Since the negative is developed under normal processing techniques, normal contrast between the shaded background and the mounting board is achieved. This means that the boundary line 1 is visible on the final photographic print as seen in FIG. 2.

The conventional processing, as specified by the manufacturer of the film is as follows. The film type is GA 100 50 95, manufactured by Eastman Kodak Company, USA.

The film was exposed to artwork under the following conditions:

(i) film was at a distance of about 21 inches from the artwork;
(ii) an f stop of 22 was used;
(iii) fixed distance pulsed xenon lamps were used;
(iv) shutter speed of 1/60 seconds; and
(v) an ASA of 100.

Figure 3:
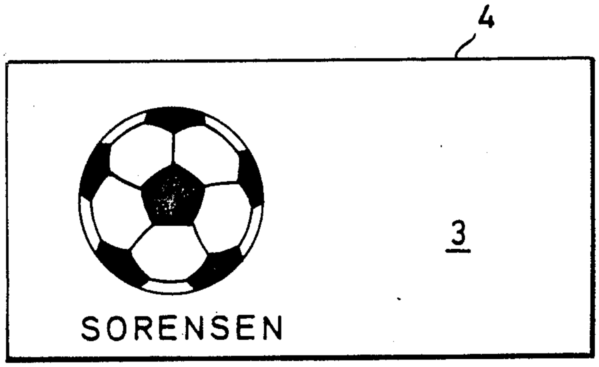
FIG. 3 illustrates the business card of FIG. 2 produced in accordance with the present invention.

In strict accordance with manufacturer's processing conditions for the exposed negative the exposed film is developed as follows:

(i) the film developed in developer, namely, Kodak (Trade Mark) Flexicolor process C41 mixed to manufacturer's specification, at 37.8° C. for 3 minutes and 15 seconds;

(ii) the film was agitated continuously while in developer;

(iii) the film subsequently immersed in bleach for 6 minutes and 30 seconds;

(iv) the film then washed for 3 minutes and 15 seconds at a flow-rate of 3 to 4 litres per minutes;

(v) the film then fixed for 6 minutes and 30 seconds;

(vi) the film then washed for 3 minutes and 15 seconds; and (vii) the film finally stabilized for 1 minute and 30 seconds In contrast to this, the card illustrated in FIG. 3 has been produced in accordance with the present invention, that is to say, the developing of the exposed unit has been done under conditions outside the limits specified by the manufacturer. In this case, the boundary 1 between the artwork and the background of the mounting is not distinguishable owing to the enhanced overall density of the negative and decreased contrast between the shaded background of the artwork and the similar coloured white background of the mounting board.

The exposed negative for producing the business card of figure 3 was developed as follows:

(i) the film developed in developer, namely, Kodak (Trade Mark) Flexicolor process C41 mixed to manufacturer's specification, at 40° C. for 5 minutes;

(ii) the film was agitated continuously in both directions every 7 seconds at 56 RPM;

(iii) the film was subsequently immersed in bleach for 5 minutes;

(iv) the film was then washed for 1 minute at a flow-rate of 2 litres per minute;

(v) the film then fixed for 5 minutes;

(vi) the film then washed for 5 minutes at a flow-rate of 2 litres per minute; and (vii) the film was finally stabilized for 1 minute.

Although the example has been described with reference to the shaded and white background, the effect is applicable to all colors.

More specifically, the present process embodying the present invention may comprise the following five stages.

(i) Making of the Artwork:

Material required from the client is for example catalogues or pictures of products, pictures of persons, specified text to be used, e.g. names, addresses, Company's Logo. Logos which are not usable directly may be reproduced by using the Reprocopying process on reversal bromide graphic paper and negative print. In this case the negative print is dipped into an etching solution to be bleached white. It is then washed, and dried. Color dyes are then added to the remaining paper emulsion. It is then dried and can be pasted onto the artwork.

The finished artwork must be dimensions proportion in ration to the finished card, whose actual size is e.g. 89 mm×55 mm+/_1 mm. Optionally the card may have white border e.g. 3 mm all round.

(ii) Photography:

The finished artwork is copied with a 35 mm SLR camera onto a 35 mm color negative or with a large format camera onto a 60 mm ×90 mm color negative.

(iii) Film processing:

The exposed color negative film is processed Kodak Flexicolor Process C41 (Trade Mark) or compatible process. The developing conditions are deliberately chosen to be outside the normal process tolerances for conventional processing (such as those conditions given above), in such a way as to produce a final color negative of high or very high-contrast compared with the contrast of one that is processed "normally". This greatly improves reproduction of the text of the artwork. One particularly convenient way of obtaining greatly enhance contrast in the negative, is to process the film by the C41 process generally as specified by the manufacture but with a developing time in the first chemical, that is the developer, above four minutes. It has been found that excellent results are obtained if the film is processed in the developer for four minutes and 30 seconds with the chemical temperature at 40° C., in a room temperature of about 26° C. With lower temperatures, the development time may be increased. Alternatively, with the developer chemical at a higher temperature the processing time may be made shorter while still producing a high-contrast color negative. A further step which can be taken to increase the contrast is to agitate the film in the developer three or four or more times the agitation specified in the standard C41 process. Combinations of increased temperature and increased agitation can be used to obtain the desired very high-contrast color negative. The room temperature value does not have a very significant effect on the contrast.

(iv) Printing:

The processed color negative is then printed onto sensitised roll colour photographic paper with an additive or subractive filtration color printer.

(v) Paper processing:

The exposed roll color photographic paper is then processed in Kodak Ektaprint 2 Process EP2 (Trade Mark) or compatible process. The processed roll color photographic paper is then cut into individual cards.

The described process is simple and economical since only a single medium namely the color negative is used as an intermediate between the artwork and the finished card. The contrast of the medium is controlled, to give the best possible reproduction of color and text of the artwork. The process of the invention enhances the density of the negative so as to enhance distinction between areas of similar shade of substantially the same color. The preparation of the artwork involves no special measures and is therefore simple and ecnomical. A skilled artist is not required, nevertheless there is no restriction on the creativity, layout, and design of the artwork.

The present process is economical even for volumes as small as ten cards.

The difference between conventional processing and the abnormal processing conditions of the present invention clearly leads to the advantage that bold business cards can be produced by photographing artwork in a single step, the artwork comprising text and pictures which have been cut-out of magazines and the like and pasted-up on a board. There is no need to pay too much attention to slight difference in color between the color of the mounting board and the background of the cut-out text or pictures since the process embodying the invention will merge minor color differences which may exist, thereby producing a tidy and prominent business card.

Having thus described the invention, what is claimed is:

1. A method for producing business cards, name cards and the like in color, the steps comprising: (a) assembling artwork comprising images and characters on a substrate of similar background color to form a composite artwork for a business card, name card or the like, said images and characters comprising a multiplicity of colors; (b) exposing in a single step a unit of color film to said artwork to reproduce it thereon; (c) developing said exposed unit of color film under processing conditions which are abnormal with respect to the processing conditions as generally specified by the manufacturer of the color film, which processing conditions involves one of: (i) immersing said exposed unit of color film in a first chemical, at a given temperature, and (ii) developing for a given time period, the exposed unit of color film in the first chemical at a temperature which exceeds the maximum specified by the manufacturer for said given time period; in order to provide a single developed color negative having very high-contrast and containing all of said artwork; (d) printing only said single developed color negative onto color photographic paper in the desired size to reproduce the artwork thereon in a multiplicity of colors substantially corresponding to those of said artwork and substantially devoid of boundary lines resulting from variations in shade of the backgrounds of said substrate and said artwork; and (e) cutting said printed color photographic paper to the desired card size and thereby to provide a desired card in color.

2. The method of producing business cards, name cards and the like in color according to claim 1, wherein said developing step comprises immersing said single color negative in a developer chemical for a time period of substantially 4 minutes and 30 seconds, said developer chemical being at a temperature of 40° C., thereby to provide said very high-contrast.

* * * * *

UNITED STATES PATENT AND TRADEMARK OFFICE
CERTIFICATE OF CORRECTION

PATENT NO. : 4,948,709

DATED : August 14, 1990

INVENTOR(S) : Soo Liat Koh et al

It is certified that error appears in the above-identified patent and that said Letters Patent is hereby corrected as shown below:

Column 7, line 19, after "temperature", insert--for a developing time which exceeds the maximum time specified by the manufacturer for said given temperature--.

Signed and Sealed this

Third Day of March, 1992

*Attest:*

HARRY F. MANBECK, JR.

*Attesting Officer*

*Commissioner of Patents and Trademarks*